(12) United States Patent
Bond (10) Patent No.: US 11,853,031 B2
(45) Date of Patent: Dec. 26, 2023

(54) THREE-DIMENSIONAL PART FABRICATION FROM A WORKPIECE USING VISUAL GLYPHS

(71) Applicant: Brett Bond, Summit, NJ (US)

(72) Inventor: Brett Bond, Summit, NJ (US)

( * ) Notice: Subject to any disclaimer, the term of this patent is extended or adjusted under 35 U.S.C. 154(b) by 44 days.

(21) Appl. No.: 18/115,071

(22) Filed: Feb. 28, 2023

(65) Prior Publication Data

US 2023/0213914 A1    Jul. 6, 2023

Related U.S. Application Data

(63) Continuation-in-part of application No. 18/083,638, filed on Dec. 19, 2022, which is a continuation of application No. 17/846,184, filed on Jun. 22, 2022, now Pat. No. 11,609,550.

(51) Int. Cl.
| | |
|---|---|
| *G05B 19/414* | (2006.01) |
| *G05B 19/25* | (2006.01) |
| *B23Q 17/22* | (2006.01) |
| *G06F 30/20* | (2020.01) |
| *B23B 49/02* | (2006.01) |
| *B23B 39/26* | (2006.01) |

(52) U.S. Cl.
CPC .......... *G05B 19/4145* (2013.01); *B23B 39/26* (2013.01); *B23B 49/02* (2013.01); *B23Q 17/22* (2013.01); *G05B 19/253* (2013.01); *G06F 30/20* (2020.01)

(58) Field of Classification Search
None
See application file for complete search history.

(56) References Cited

U.S. PATENT DOCUMENTS

2021/0331280 A1*   10/2021   Sheldon ................ B23Q 3/002

* cited by examiner

*Primary Examiner* — Ryan A Jarrett
(74) *Attorney, Agent, or Firm* — Michael J. Feigin, Esq.; Feigin and Fridman LLC (57) ABSTRACT

Cutting a workpiece using a cutting tool associated with a system, whereby the system includes a guide having a first glyph and second glyph. The first and second glyphs are both visible on a single side of the guide. The guide is associated with a specific three-dimensional model of a plurality of three-dimensional models. The system further includes an input mechanism, configured to receive a location of the first glyph and of the second glyph, relative to the cutting tool. The system further includes a control system, functionally associated with the input mechanism and with the cutting tool. The control system is configured to direct the cutting tool to cut a version of the specific three-dimensional model into the workpiece at a location, such as at least partially between the locations of the first glyph and the second glyph, which locations were received by said input mechanism.

20 Claims, 6 Drawing Sheets

FIG. 10

THREE-DIMENSIONAL PART FABRICATION FROM A WORKPIECE USING VISUAL GLYPHS

FIELD OF THE DISCLOSED TECHNOLOGY

The disclosed technology relates generally to methods of creating precision parts, and, more specifically, to a method and a system for precisely cutting a three-dimensional shape into a workpiece, using visual indicia or glyphs.

BACKGROUND OF THE DISCLOSED TECHNOLOGY

Cutting machines, such as computer numerical control (CNC) machines, are precision machines capable of accurately manipulating (e.g. cutting, bending, etching, 3d printing) a workpiece, based on a program listing and related parameters provided to a machine via a computer.

In the prior art, in order to achieve accurate, repeatable CNC-machined parts that comply with design tolerances, it is commonly necessary to specify a large number of parameters for each machining operation, typically using Computer Aided Manufacturing (CAM) software. These parameters may include the material's physical position relative to a work coordinate system offset defined in the machine's control software, such as "G54," the default work coordinate offset commonly used in G-Code-based systems. The complete set of required parameters supplied to the CAM software, can then be used to generate CNC machine control commands, for example G-Code.

At the CNC machine, the machinist positions and fixes the material to the worktable and sets the coordinates, telling the CNC machine where to start running operations. The position of the material on the work-table, if needed, is then compensated for in the CNC controller's software, such as by modifying the coordinates of the work offset. In practice, alignment and fixturing of the workpiece often involves several time-consuming corrective steps, particularly for novice CNC machinists. Often, modifications to the CAD model, the CAM toolpath, the output G-Code, the CNC controller work offsets, the material itself, and possibly all of the above, are made before activating the machine to produce an in-tolerance part.

In addition to workpiece positional parameters and their adjustment, many other parameters must often be modified and refined to obtain acceptable CNC performance. Adjustment of such parameters requires skilled operator time, often consumes extra material for test passes, can result in damage to parts, damage to tools, and occasionally damage to the CNC equipment itself.

Furthermore, machining a shaped pocket or slot in a workpiece, which slot is designed to receive a correspondingly shaped piece, can generate additional complexity. For example, the pocket or slot must be very precisely shaped and the piece must be correspondingly precisely shaped to fit into the slot. Such cases require accurate matching of parameters of the cutting machine forming the slot to those used to generate the inserted piece. These require significant operator skill in measurement and material placement. This precise material cutting requires additional skill and time, can often lead to mistakes, and/or wasted material both from requiring multiple test runs, and from performing machining operations such as drills, slots or cuts on a larger piece of material stock to account for reduced predictability of the cut path.

It is common practice among carpenters and various material workers to mark indicia on a material to be cut or worked. Simple material marks, such as scoring material with tools such as scribes, punches or even just pen or pencil marking, make it possible to accurately measure and mark important positions relative to previously-faced and squared precision edges, corners and surfaces, either provided by the stock material or from a prior machining operation. For instance, to define the point where a hole is to be drilled, a machinist may typically measure with a ruler, caliper or micrometer, then scribe or mark a line relative to (parallel, perpendicular, or at a designed angle thereto) a precisely machined material edge, then measure and punch a hole location along the marked line. This small indication on the material can provide a starting point for a drilling or milling operation both by its visual location and as a physical indentation to guide the drill. Prior to the advent of CNC tooling, and even to the present day this is common practice. "Precise" is defined as within a tolerance level wherein the workpiece fits within the pocket or slot according to the designed type of fit such as a clearance, transition or interference fit.

Indicia such as dots, crosses (exes), or lines drawn on material, on paper or on computer drawings may be used to define a set of indication primitives intended to guide the machinist on how to fabricate a part within the designed tolerance. Informally, any indicia that allows a machinist to repeatably produce in-tolerance results are acceptable. More formally, a symbolic language known as Geometric Dimensioning and Tolerancing (GD&T), as defined under several international standards such as ASME Y14.5 or ISO Geometrical Product Specifications consists of a rich set of visual indicia. Such indication primitives are commonly used in modern CAD software as the basis for sketching dimensioned drawings, which can be built upon to create 3-dimensional models. As is commonplace in manual operations, indications on a material work-piece can provide tightly-toleranced and detailed engineering specifications directly on the material prior to performing a variety of machining operations using manual machines such as manual mills, lathes, drill presses, saws, sheet metal tools such as brakes and sheers, and other common machine shop equipment.

Furthermore, those same indication primitives have been used and improved by carpenters, metal workers and builders for centuries. As metrology and marking tools and techniques advance, so too has precision increased in machining operations. For precision machining these markings are typically called out relative to a starting reference surface, commonly a finely ground flat stone such as a surface plate from which all other measurements are taken.

The centuries-old process of measuring from a reference surface, then marking, and cutting has languished in the modern CNC workshop. The skillset specialization required has created a rift between the industrial designer, mechanical engineer, CNC part programmer and CNC machine operator, though it is widely acknowledged that rapid part iteration allows engineers and machinists alike to experiment and improve designs, adjusting dimensions and refining parts as needed. A rapid and easy process to work in this iterative methodology has been hampered due to the complexity of the software and of operating CNC equipment. CNC machines are more capable than ever, but are also more time consuming, costly, difficult and often frustrating to use, so much so that skilled machinists can often manually machine a wide range of parts in less time and more efficiently than working with CNC machines.

Despite the increasingly wide availability of CNC machinery, in both amateur and professional workshops a wide range of electrical, pneumatic and hydraulic or otherwise powered tooling may be found in use today. Many of these tools duplicate functionality that can be performed by a single CNC machine, and are only used because use of the CNC machines is so complex. As such, the complexity of use of CNC machines results in duplication of workshop functionality, having a high price-tag. As mentioned, the set of parameters that frequently require skillful adjustment are large and complex, and relate to many aspects of the material, the work table, tooling, fixtures, the planned machining process, and the machine in use. CAM software available on the market such as Autodesk's Fusion 360, Carbide's Create, Vectric's Aspire, Inventable's Easel, and others, offer reduction in number of input parameters by providing templates, defaults, tool path simulation, and other simplifications. However, since these software products have little awareness of workpiece position in the physical world, some of the most tedious parts of CNC machine operation remain. Furthermore, simplification of CAD and CAM tools, often results in the operator having less control over desired parameter settings.

At the other end of the complexity and cost spectrum, high-end CAM software such as Hexagon's Esprit offers detailed physical simulation of the operating characteristics of thousands of particular makes and models of CNC machinery, so toolpaths can be planned by a CNC programmer at a desk rather than an operator at the machine. Some CAM software packages such as Mazak's Smooth AI Spindle offer real-time measurement and compensation during cutting operations such as chatter control whereby speeds and/or feed rates are adjusted in real-time if chatter is detected. These are welcome advances in the part fabrication process, however none of these remedy the core dilemma of locating material and machining operation offsets.

There is thus a need in the art for a method and a system for simple and precise cutting into a workpiece, in order to quickly produce high-precision results.

SUMMARY OF THE DISCLOSED TECHNOLOGY

The disclosed technology provides a method and a system for precisely iso cutting a three-dimensional shape into a workpiece, using visual indicia or glyphs.

A workpiece (an object to be cut into such as one made out of wood or plastic) is cut in embodiments of the disclosed technology based on where a guide is placed there-on. A guide, which has a version of, representation of, or other image which is recognizable by a person/human operator to be of a specific-shaped cut to be made in the workpiece, is placed on the workpiece. The guide has at least a first glyph and second glyph visible on a single side thereof. The guide can be translucent (able to see the workpiece there-under) or opaque. Glyphs on the guide are used to orient a cutting tool which cuts based on a position of the glyphs, such as between the glyphs in the shape of, or based on, the shaped object to be cut which is visible to a human on the guide.

Each guide of a plurality of guides is associated with a specific three-dimensional model of a plurality of three-dimensional models. Such three-dimensional models can be stored electronically while glyphs or indicia on the guide are a physical representation of, or associated with, the glyphs or indicia in the model(s). An input mechanism (such as a typical visible light sensing, or infrared sensing camera) receives a location of the first glyph and the second glyph relative to a cutting tool. The cutting tool can be part of a CNC (computer numerical control) machine. The cutting tool is directed to cut a version of the specific three-dimensional model into the workpiece at a location at least partially between a determined location of the first glyph and the second glyph. Additional glyphs can be used in embodiments of the disclosed technology along with the first and second glyph.

For purposes of this disclosure "version of" is defined as "a particular form thereof which differs in certain respects from the original or subsequent forms of the same shape or object, with the differentiation being at least one of scale, orientation, depth, or rotation".

The guide is removed from the workpiece after the input mechanism receives the location of the first glyph and second glyph and before the cutting tool is directed to cut a version of the three-dimensional model, in embodiments of the disclosed technology. That is, the location is stored/known to a machine or system controlling the cutting tool by reading a position and size of the glyphs on the workpiece, and then the workpiece can be cut into without presence of the guide which can now be reused for subsequent cuttings of the workpiece or different workpieces. The workpiece must remain stationary in space relative to a position in which was determined by the machine or system controlling the cutting tool between detection of the position of the cutting and the cutting itself.

An operator of the cutting tool can select a guide which is associated with a specific three-dimensional model, or associate a specific three-dimensional model with a specific guide. Code visible on the guide is obtained via an input mechanism and the code can further be used in the step of associating the specific three-dimensional model with the guide. For example, an operator may choose a three-dimensional model, print a QR code and/or other glyphs on a guide, and associate the code/glyphs with the three-dimensional model for carrying out cutting based on the specific three-dimensional model when the code/glyph is detected in the future. The code can be printed or handwritten text or non-human readable such as QR code.

The first glyph and the second glyph are spaced apart from each other and a two-dimensional version or visualized representation of the three-dimensional model is visible on the guide between the first glyph and the second glyph in embodiments of the disclosed technology. The cutting tool cuts substantially in a shape, orientation and magnification level of the two-dimensional version or representation of the three-dimensional model in some embodiments of the disclosed technology. When the guide is translucent, simultaneous viewing of the first glyph, second glyph, two-dimensional version or representation of the three-dimensional model, and a portion of the workpiece on which the guide is placed are visible.

The three-dimensional model, in embodiments of the disclosed technology, is stored electronically and has an electronic representation of said first glyph, an electronic representation of said second glyph, and parameters of said three-dimensional model, for which a representation of, or version of, is cut by the cutting tool at the location at least partially between the first glyph and the second glyph.

A kit comprises the workpiece, a guide adapted for placement on the workpiece, the guide further having a first glyph and second glyph visible on a single side of the guide. The guide is associated with a specific three-dimensional model of a plurality of three-dimensional models via a QR code encoding an identifier of the model. An input device is adapted to receive a location of the first glyph and the second glyph relative to a cutting tool. A control system is configured to move the cutting tool in a manner such that a version of the specific three-dimensional model is cut into the workpiece at a location at least partially between a determined location of the first glyph and the second glyph. In other embodiments, the cut can be based on positions of the glyphs, offset based on a distance and magnification of the glyphs.

The control system is adapted to direct the cut into the workpiece after the input device receives the location of the first glyph and second glyph and before the specific three-dimensional model is cut into the workpiece in embodiments of the disclosed technology. The guide can be, or is, removed from the workpiece after a location thereof (or glyphs thereon) is determined and before the cutting takes place. Code visible on the guide is obtainable and/or obtained via the input device, the code further usable in associating a specific three-dimensional model with a specific guide. In some embodiments the cutting position is determined based on positioning a camera over the glyph, recording the position of the glyph, subtracting the camera offset and determining the tool position. The tool is then placed over the center of the glyph.

"Substantially" and "substantially shown," for purposes of this specification, are defined as "at least 90%," or as otherwise indicated. "identical" or "exactly," for purposes of this specification, is defined as "within an acceptable tolerance level known in the art." Any device may "comprise," or "consist of," the devices mentioned there-in, as limited by the claims. Any element described may be one of "exactly" or "substantially," as described.

It should be understood that the use of "and/or" is defined inclusively, such that the term "a and/or b" should be read to include the sets: "a and b," "a or b," "a," or "b."

DETAILED DESCRIPTION OF EMBODIMENTS OF THE DISCLOSED TECHNOLOGY

A system for cutting a workpiece using a cutting tool associated with the system, includes a guide having a first glyph and second glyph. The first and second glyphs are both visible on a single side of the guide. The guide is associated with a specific three-dimensional model of a plurality of three-dimensional models. The system further includes an input mechanism, configured to receive a location of the first glyph and of the second glyph, relative to the cutting tool. The system further includes a control system, functionally associated with the input mechanism and with the cutting tool. The control system is configured to direct the cutting tool to cut a version of the specific three-dimensional model into the workpiece at a location, such as at least partially between the locations of the first glyph and the second glyph, which locations were received by said input mechanism. In some embodiments, the system may further include the cutting tool, such as a CNC machine. In some embodiments, the system may further include the workpiece, such as a wood or plastic workpiece. A bending element or 3D printing nozzle can also be used to produce the workpiece.

A work-piece cutting kit for cutting a workpiece using a cutting tool, includes a guide configured for placement on the work-piece. The guide comprising a plurality of glyphs visible on a single side of the guide. The guide is associated with a specific three-dimensional model of a plurality of three-dimensional models. The kit further includes an input device configured to receive a location of the first glyph and of the second glyph relative to the cutting tool. The kit further includes a control system, configured to be functionally associated with said cutting tool and said input device. The control system is configured to move the cutting tool in a manner such that a version of the specific three-dimensional model will be cut into the work-piece at a location at least partially between received locations of the first glyph and of the second glyph. In some embodiments, the kit may further include the workpiece.

A method for cutting a three-dimensional shape into a work-piece, includes placing a guide onto the work-piece. The guide has a first glyph and second glyph, both visible on a single side of the guide, and is associated with a specific three-dimensional model of a plurality of three-dimensional models. The method further includes receiving, by an input mechanism, a location of the first glyph and of the second glyph relative to a cutting tool. The method further includes directing the cutting tool to cut a version of the specific three-dimensional model into the work-piece at a location at least partially between the location of the first glyph and the location of the second glyph, received by the input mechanism.

Embodiments of the disclosed technology will become clearer in view of the forthcoming description of the figures.

Figure 1:
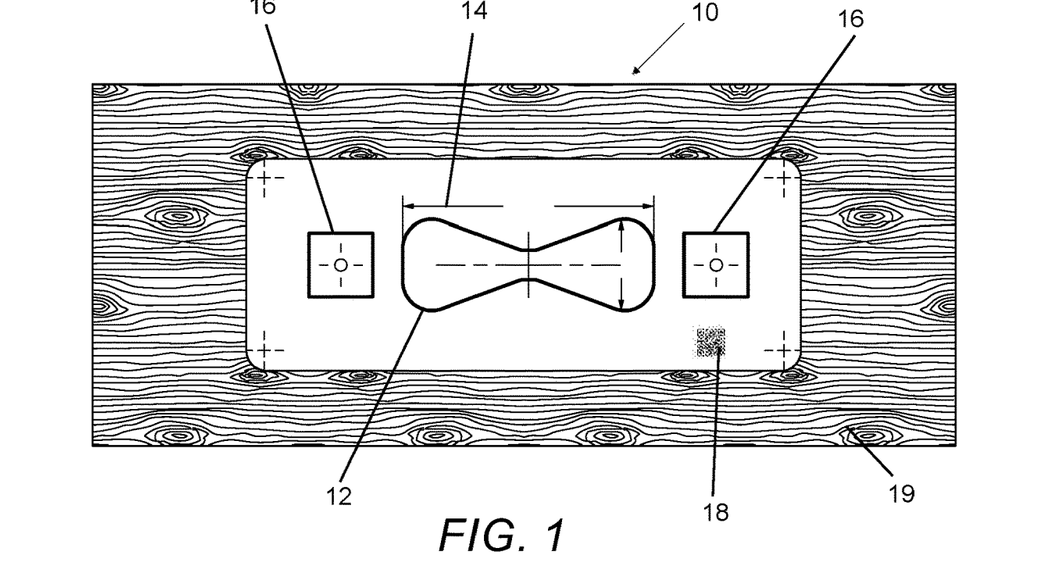
FIG. 1 shows a guide for cutting a workpiece according to an embodiment of the disclosed technology.

FIG. 1 shows a guide 10 for cutting a workpiece according to an embodiment of the disclosed technology. As seen, the guide 10 includes a representation 12 of a specific-shaped cut to be made in a workpiece. The representation 12 may be a version of the specific shaped cut, or any type of image which is recognizable by a person, and particularly by a human operator of a cutting machine. For purposes of this disclosure "version of" is defined as "a particular form thereof which differs in certain respects from the original or subsequent forms of the same shape or object, with the differentiation being at least one of scale, orientation, depth, or rotation".

In some embodiments, representation 12 may include indications 14 of dimensions (or linear dimensions on a two dimensional plane) of the specific-shaped cut to be made in the workpiece. Guide 10 has at least first and second glyphs 16, both of which are visible on a single side thereof. As shown, the glyphs 16 may be placed on the same side of guide 10 as representation 12. Typically, representation 12 is disposed between glyphs 16.

In some embodiments, guide 10 may be translucent, such that when it is placed on a workpiece, the workpiece disposed under the guide is visible through the guide. In some embodiments, guide 10 may be opaque.

Guide 10 is associated with a specific three-dimensional model of a plurality of three-dimensional models. The model associated with guide 10 is described hereinbelow with respect to FIGS. 8A and 8B. The three-dimensional model may be stored electronically, while the guide includes a physical representation of indicia stored in the model such as printed on the guide 10.

In some embodiments, a plurality of guides 10 may be used, where each of the guides 10 may be associated with a different three-dimensional model of a plurality of models.

In some embodiments, guide 10 may further include code 18, visible on the guide. Code 18 may be plain text or non-human readable. For example, code 18 may include a QR code, additional glyphs other than glyphs 16, or handwritten directives. As explained in further detail hereinbelow, code 18 may be used to associate guide 10 with the specific three-dimensional mode, as explained in further detail hereinbelow.

In some embodiments, guide 10 may be disposed within a rigid frame, such as wooden frame 19, to ensure that the guide retains is flat shape, and is sturdy enough to be used many times.

Figure 2:
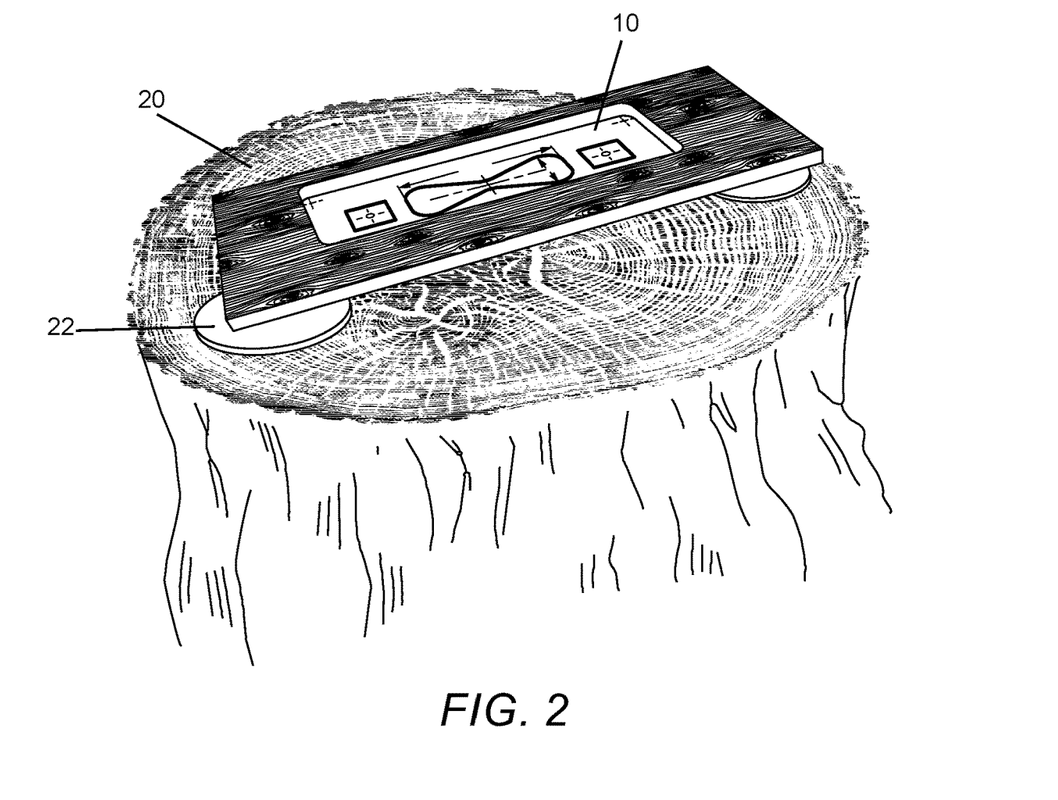
FIG. 2 illustrates the guide of FIG. 1 placed on a workpiece, according to an embodiment of the disclosed technology.

FIG. 2 illustrates guide 10 placed on a workpiece 20, according to an embodiment of the disclosed technology. In the illustrated embodiment, workpiece 20 constitutes a block of wood. However, in other embodiments, workpiece 20 may be formed of plastic, metal, ceramics, natural materials like stone, foam, composite materials such as carbon fiber and epoxy resin, or any other material suitable for cutting using a cutting machine.

In some embodiments, guide 10 may be placed directly onto a surface of workpiece 20. In some other embodiments, workpiece 20 may include (temporary or permanent) raising pedestals 22, onto which guide 10 is placed. Guide 10 is specifically positioned a region of workpiece 20 into which it is desirable to cut a three-dimensional shape corresponding to representation 12 on the guide.

When guide 10 is translucent, first and second glyphs 16, two-dimensional representation 12, and a portion of workpiece 20 on which guide 10 is placed, are simultaneously visible.

Figure 3:
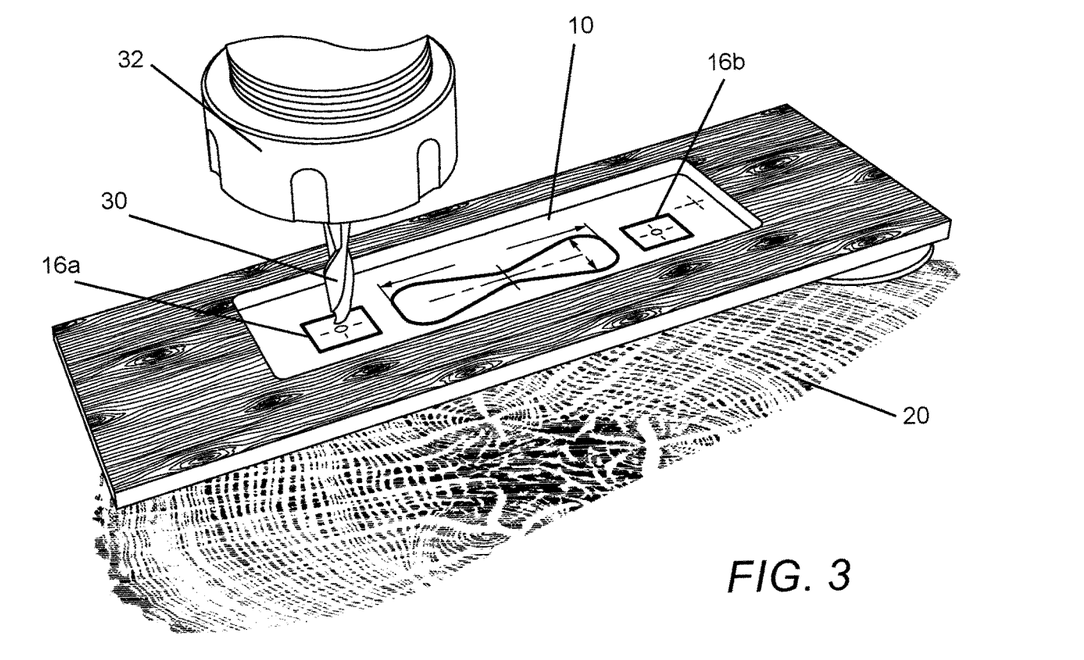
FIG. 3 shows a step of identifying the location of glyphs on the guide, relative to a cutting tool, according to an embodiment of the disclosed technology.

FIG. 3 shows a step of identifying the location of glyphs 16 on guide 10, relative to a cutting tool 30 of a cutting machine 32, according to an embodiment of the disclosed technology. As seen, cutting tool 30 is aligned with first glyph 16a, and may subsequently be aligned with the second glyph 16b. Typically, an input mechanism, such as a visible light or infrared camera, receives a location of the first glyph and of the second glyph, relative to cutting tool 30. For example, the input mechanism may be mounted onto cutting tool 30, or may form part of the cutting tool.

Following receipt of the location of glyphs 16a and 16b, guide 10 may be removed from workpiece 20. Stated differently, the locations of glyphs 16a and 16b are stored, or are received by a control system (not explicitly shown) controlling the cutting tool, and the workpiece can then be cut without presence of guide 10. Consequently, guide 10 can be reused for subsequent cuttings of workpiece 20 or of other workpieces.

Figure 4:
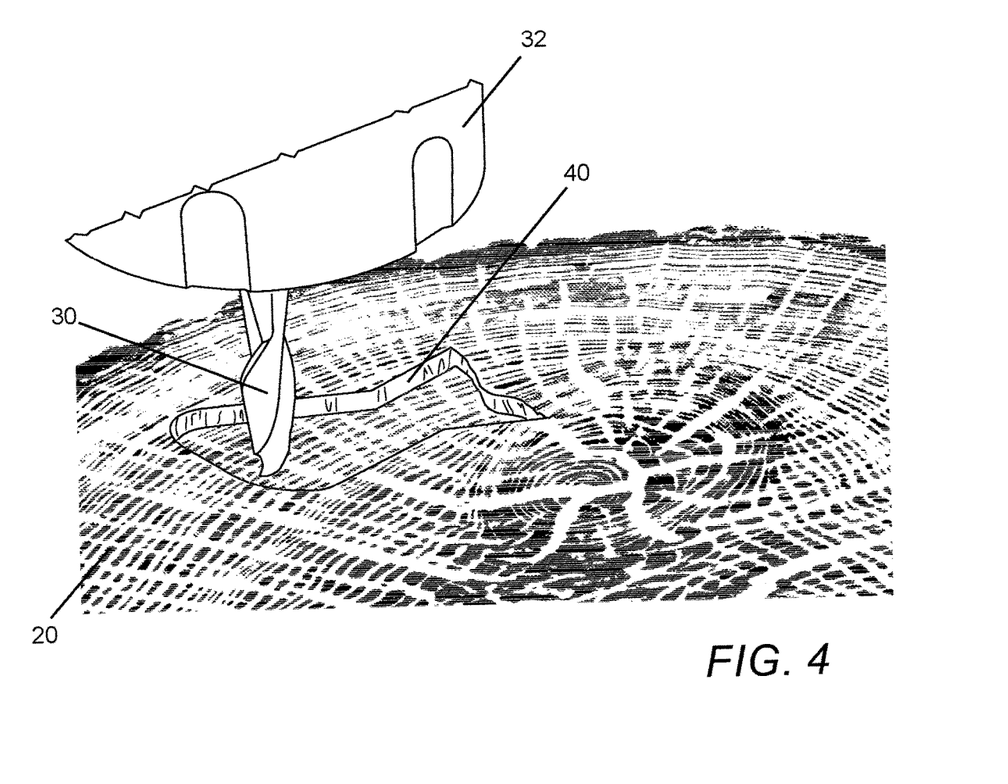
FIG. 4 illustrates cutting into the workpiece using the cutting tool, according to an embodiment of the disclosed technology.
Figure 5:
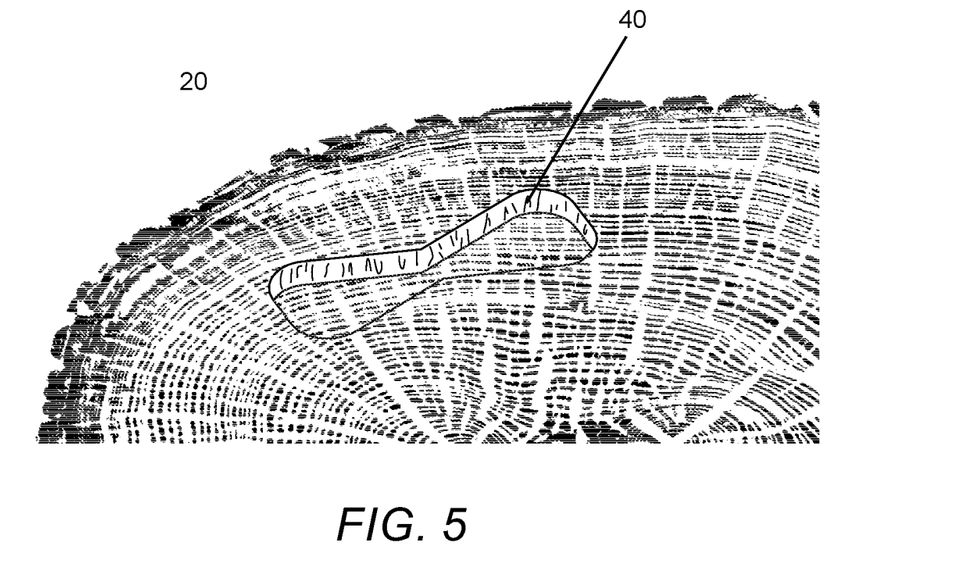
FIG. 5 shows the cut region in the workpiece, resulting from the cutting step of FIG. 4.

In FIG. 4, following removal of guide 10 from workpiece 20, cutting tool 30 is directed, for example by a control system (not explicitly shown), to cut into workpiece 20, according to an embodiment of the disclosed technology. FIG. 5 shows the cut region 40 in the workpiece, resulting from the cutting step of FIG. 4.

Cutting tool 30 cuts substantially in a shape, orientation and magnification level of the two-dimensional representation 12, which is a representation of the three-dimensional model associated with guide 10. Specifically, the depth of cut region 40 corresponds to the depth in the three-dimensional model associated with guide 10, even though this depth is not explicitly shown on the guide. The two-dimensional representation 12 can also be an indication of linear or radial dimensions. The location into which cutting tool 30 makes the cut is disposed between the received or identified locations of the first and second glyphs 16a and 16b, shown in FIG. 3.

It is to be appreciated that between the detection step (shown in FIG. 3) and the actual cutting (shown in FIG. 4), workpiece 20 must remain stationary in space, relative to the cutting tool 30 and/or to the position in which the locations of glyphs 16a and 16b were detected or determined.

Figure 6:
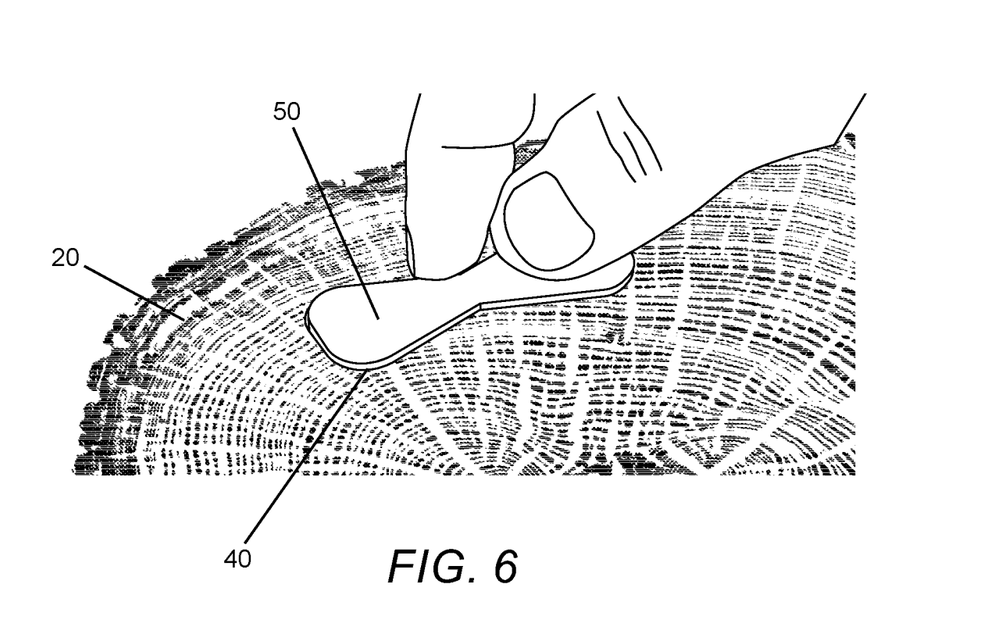
FIG. 6 illustrates insertion of a three-dimensional inlay, corresponding in shape to the cut region, into the cut region in the workpiece, according to an embodiment of the disclosed technology.
Figure 7:
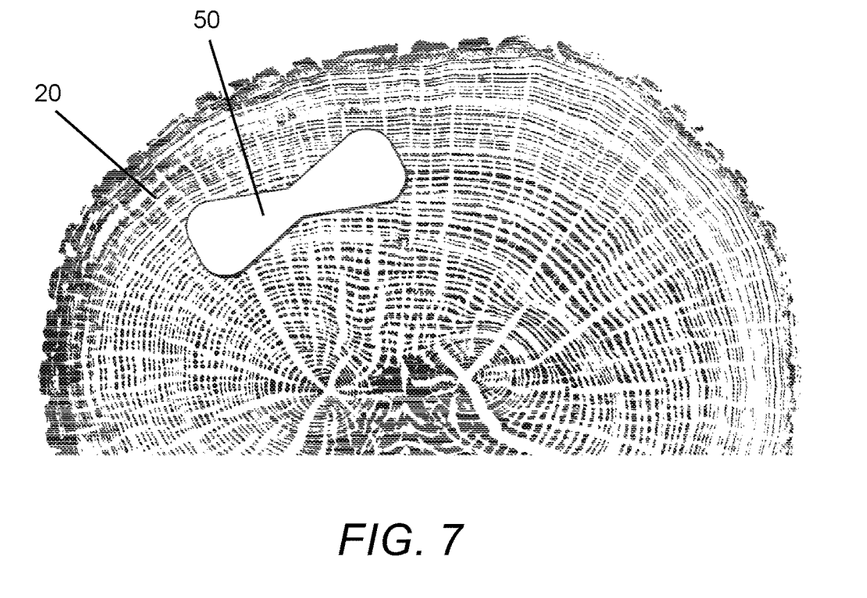
FIG. 7 illustrates the workpiece having the inlay disposed therein, according to an embodiment of the disclosed technology.

FIG. 6 illustrates insertion of a three-dimensional inlay 50, corresponding in shape to cut region 40, into the cut region in workpiece 20, and FIG. 7 illustrates the workpiece 20 having the inlay disposed therein, according to an embodiment of the disclosed technology.

As seen, inlay 50 may be placed into cut region 40 manually, and is precisely shaped to fit into the cut region. In some embodiments, inlay 50 may be cut using cutting machine 32 or cutting tool 30. In some embodiments, inlay 50 may be cut using the three-dimensional model associated with guide 10, to ensure the perfect fit between inlay 50 and cut region 40.

Figure 8A:
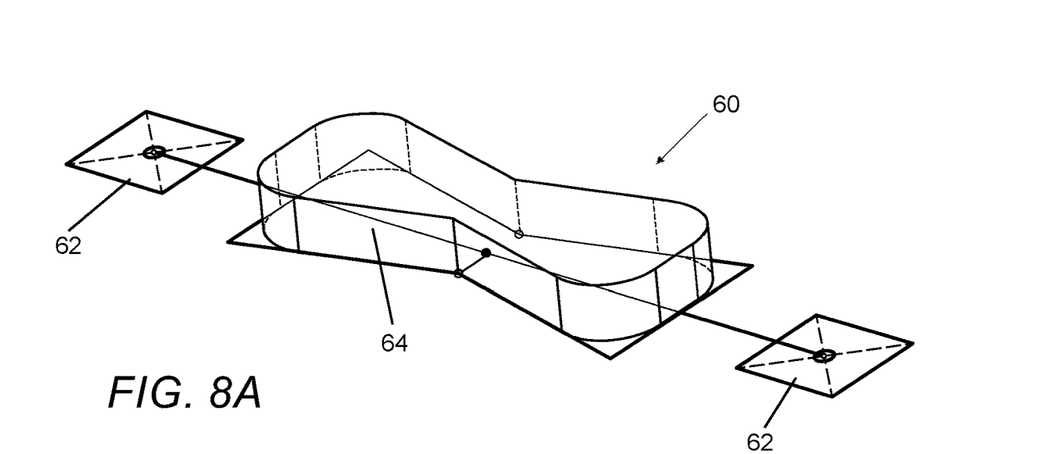
FIGS. 8A and 8B illustrate a three-dimensional model associated with the guide shown in FIG. 1, in accordance with embodiments of the disclosed technology.
Figure 8B:
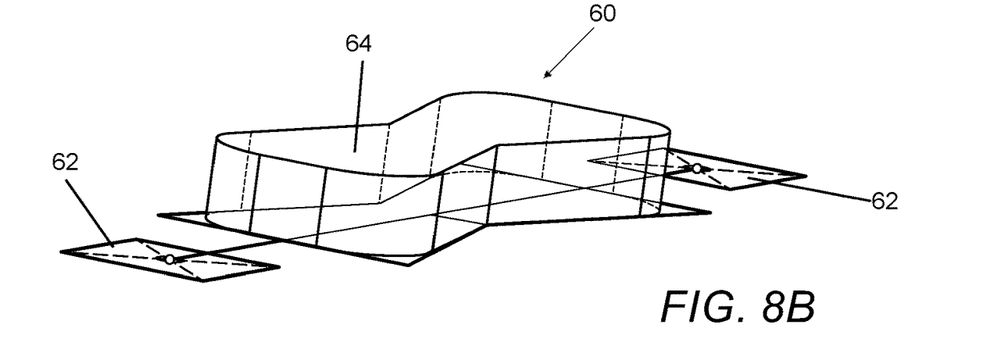

FIGS. 8A and 8B illustrate a three-dimensional model 60 associated with guide 10, in accordance with embodiments of the disclosed technology. Three-dimensional model 60 is typically stored electronically. Three-dimensional model 60 includes an electronic representation 62 of each of glyphs 16 (see FIG. 1), and parameters for cutting a three-dimensional model, corresponding in shape to two-dimensional representation 12 of guide 10. The parameters may include definitions of angles, dimensions, and depth of a three-dimensional shape to be cut into a workpiece, such as workpiece 20, between the locations of the glyphs 16.

Figure 9:
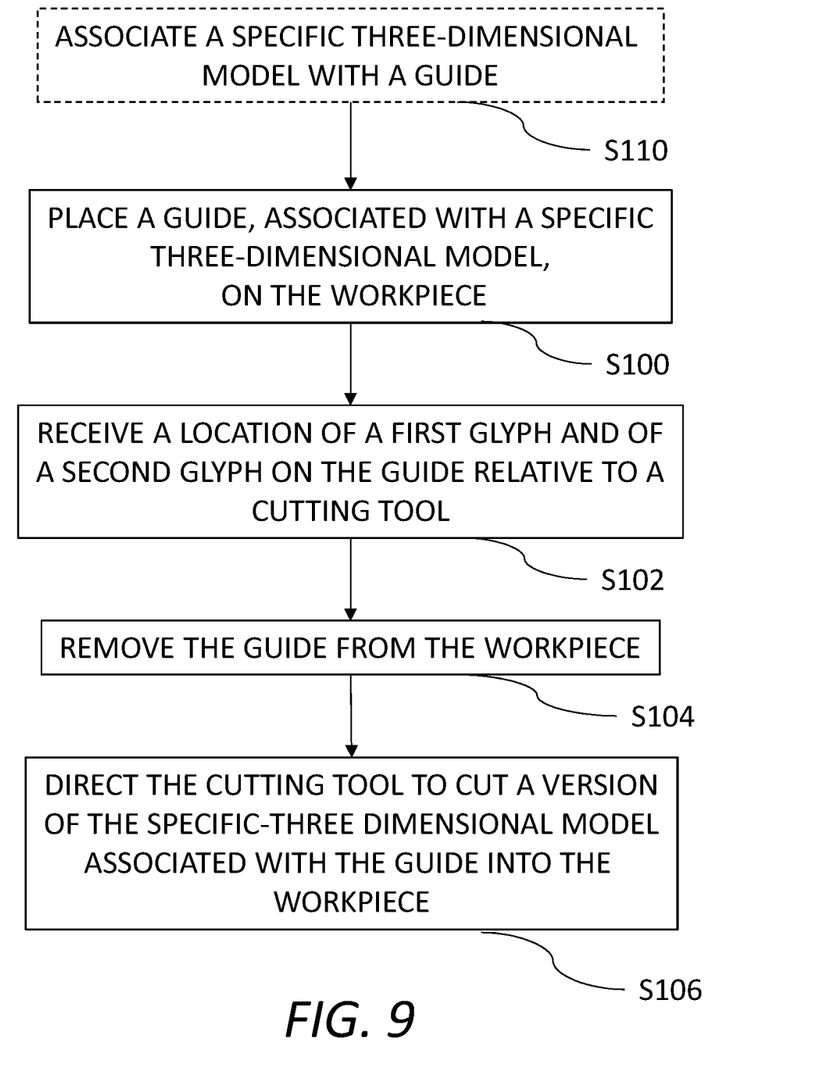
FIG. 9 is a flowchart of a method of cutting into a workpiece in accordance with an embodiment of the disclosed technology.

FIG. 9 is a flowchart of a method of cutting into a workpiece in accordance with an embodiment of the disclosed technology, for example as described hereinabove with reference to FIGS. 2 to 5.

At step S100, a guide having a first glyph and a second glyph visible on a single side thereof, is placed onto a workpiece. The guide is associated with a specific three-dimensional model of a plurality of three-dimensional models. For example, the guide may be guide 10 of FIG. 1.

At step S102, a location of the first glyph and the second glyph relative to a cutting tool is received by an input mechanism. For example, as shown in FIG. 3, the cutting tool may be guided to each of the glyphs, and an input mechanism, such as a camera (e.g. a visible light camera or an infrared camera) or three-dimensional sensor (e.g. accelerometer) may detect, or identify, the position of the cutting tool relative to the glyph.

At step S104, following receipt of the locations of the glyphs, the guide is removed from the workpiece.

At step S106, which occurs subsequently to step S104, the cutting tool is directed to cut a version of the specific three-dimensional model associated with the guide into the workpiece. The cut is made between the detected locations of the first and second glyphs, which were received by the input mechanism.

In some embodiments, prior to use of guide 10, the guide is associated with a specific three-dimensional model, at optional step S110. For example, the association of the guide with the specific three-dimensional model can be accomplished by manual selection of the guide to be associated with the corresponding model. For example, such manual selection may be made by an operator of the cutting tool. In some embodiments, code 18 (FIG. 1) on the guide may be identified, for example using the input mechanism, such that association of the guide with the three-dimensional model is based on the obtained code. For example, an operator may choose a three-dimensional model, print a QR code and/or another code on a guide, and associate the code with the three dimensional model for carrying out cutting based on the specific three-dimensional model when the code is detected in the future.

Figure 10:
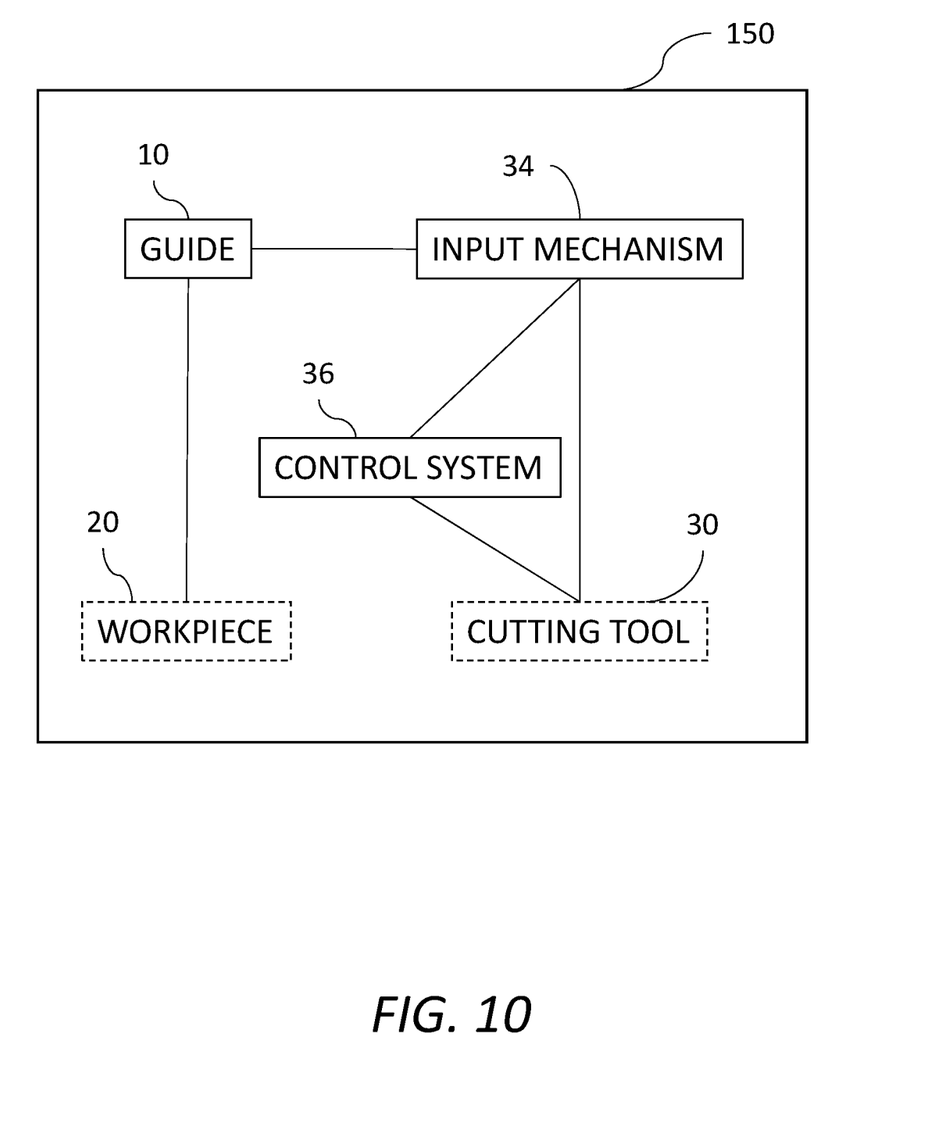
FIG. 10 is a block diagram of a system for cutting into a workpiece in accordance with an embodiment of the disclosed technology.

FIG. 10 is a block diagram of a system 150 for cutting into a workpiece in accordance with an embodiment of the disclosed technology. As seen, FIG. 10 includes guide 10, an input mechanism 34, and a control system 36. Input mechanism 34 is functionally associated with control system 36. Both the input mechanism 34 and the control system 36 are functionally associated with cutting tool 30. In some embodiments, cutting tool 30 forms part of system 150. In some embodiments, cutting tool 30 is external to system 150, and is adapted to be associated with components of the system.

In some embodiments, workpiece 20 forms part of system 150. In other embodiments, the system is adapted to modify workpiece 20, but the workpiece does not form part of the system.

While the disclosed technology has been taught with specific reference to the above embodiments, a person having ordinary skill in the art will recognize that changes can be made in form and detail without departing from the spirit and the scope of the disclosed technology. The described embodiments are to be considered in all respects only as illustrative and not restrictive. All changes that come within the meaning and range of equivalency of the claims are to be embraced within their scope. Combinations of any of the methods, systems, and devices described herein-above are also contemplated and within the scope of the disclosed technology.

I claim:

1. A system for cutting a workpiece, the system comprising: a guide with a first glyph and second glyph visible on a single side of said guide, wherein said guide is associated with a specific three-dimensional model of a plurality of three-dimensional models;
an input mechanism receiving a location of said first glyph and said second glyph relative to a cutting tool; and
a control system configured to direct said cutting tool to cut a version of said specific three-dimensional model into said workpiece at a location at least partially between a determined said location of said first glyph and said second glyph.

2. The system of claim 1, wherein said guide is placed on said workpiece before said input mechanism receives said location of said first glyph and said second glyph, and said guide is removed from said workpiece after said input mechanism receives said location of said first glyph and second glyph and before said control system directs said cutting tool to cut said version of said three-dimensional model.

3. The system of claim 1, wherein said guide is associated with said specific three-dimensional model based on a selection by an operator of said cutting tool.

4. The system of claim 3, wherein code visible on said guide is obtained via said input mechanism, said code further used in said step of associating said specific three-dimensional model with said guide.

5. The system of claim 4, wherein said code is plain printed or handwritten text.

6. The system of claim 4, wherein said code is non-human readable.

7. The system of claim 1, wherein said first glyph and said second glyph are spaced apart from each other and a two-dimensional version or visualized representation of said three-dimensional model is visible on said guide between said first glyph and said second glyph.

8. The system of claim 7, wherein said cutting tool cuts substantially in a shape, orientation and magnification level of said two-dimensional version or representation of said three-dimensional model.

9. The system of claim 7, wherein said guide is translucent allowing simultaneous viewing of said first glyph, said second glyph, said two-dimensional version or representation of said three-dimensional model, and a portion of said workpiece on which said guide is placed.

10. They system of claim 1, wherein three-dimensional model is stored electronically and comprises an electronic representation of said first glyph, an electronic representation of said second glyph, and adjustable input parameters that describe and modify the dimensions of said three-dimensional-model which is cut by said cutting tool at said location at least partially between said first glyph and said second glyph.

11. A workpiece cutting kit for cutting a workpiece using a cutting tool, the kit comprising:
a guide adapted for placement on said workpiece, said guide further comprising a first glyph and second glyph visible on a single side of said guide, wherein said guide is associated with a specific three-dimensional model of a plurality of three-dimensional models;
an input device adapted to receive a location of said first glyph and said second glyph relative to said cutting tool;
a control system configured to move said cutting tool in a manner such that a version of said specific three-dimensional model is cut into said workpiece at a location at least partially between a determined said location of said first glyph and said second glyph.

12. The kit of claim 11, said control system is adapted to direct said cut into said workpiece after said input device receives said location of said first glyph and second glyph and before said specific three-dimensional model is cut into said workpiece.

13. The kit of claim 11, wherein said guide is associated with said specific three-dimensional model based on a selection by an operator of a machine with said cutting tool.

14. The kit of claim 13, wherein code visible on said guide is obtainable via said input device, said code further usable in associating said specific three-dimensional model with said guide.

15. The kit of claim 14, wherein said code is human readable printed or handwritten text.

16. The kit of claim 14, wherein said code is non-human readable.

17. The kit of claim 11, wherein said first glyph and said second glyph are spaced apart from each other on said guide and a two-dimensional version or representation of said three-dimensional model is visible on said guide between said first glyph and said second glyph.

18. The kit of claim 17, wherein said cutting tool cuts substantially in a shape and magnification level of said two-dimensional version or representation of said three-dimensional model upon receiving instructions to begin cutting.

19. The kit of claim 17, wherein said guide is translucent, allowing simultaneous viewing of said first glyph, said second glyph, said two-dimensional version or representation of said three-dimensional model, and a portion of said workpiece on which said guide is placed.

20. The kit of claim 11, wherein three-dimensional model is stored electronically and comprises an electronic representation of said first glyph, an electronic representation of said second glyph, and parameters of said three-dimensional model which is cut by said cutting tool at said location at least partially between said first glyph and said second glyph.

* * * * *